(12) United States Patent
Zhang et al.

(10) Patent No.: US 11,380,738 B2
(45) Date of Patent: Jul. 5, 2022

(54) LED-OLED HYBRID SELF-EMISSIVE DISPLAY

(71) Applicant: Hong Kong Beida Jade Bird Display Limited, Hong Kong (CN)

(72) Inventors: Lei Zhang, Albuquerque, NM (US); Qiming Li, Albuquerque, NM (US); Fang Ou, Monterey Park, CA (US)

(73) Assignee: Hong Kong Beida Jade Bird Display Limited, Hong Kong (HK)

( * ) Notice: Subject to any disclaimer, the term of this patent is extended or adjusted under 35 U.S.C. 154(b) by 788 days.

(21) Appl. No.: 16/076,684

(22) PCT Filed: Apr. 12, 2018

(86) PCT No.: PCT/US2018/027381
§ 371 (c)(1),
(2) Date: Aug. 8, 2018

(87) PCT Pub. No.: WO2018/191551
PCT Pub. Date: Oct. 18, 2018

(65) Prior Publication Data
US 2021/0202616 A1 Jul. 1, 2021

Related U.S. Application Data

(60) Provisional application No. 62/484,979, filed on Apr. 13, 2017.

(51) Int. Cl.
*H01L 27/32* (2006.01)
*H01L 25/16* (2006.01)
(Continued)

(52) U.S. Cl.
CPC ........ *H01L 27/3225* (2013.01); *H01L 25/167* (2013.01); *H01L 27/3244* (2013.01);
(Continued)

(58) Field of Classification Search
CPC ............. H01L 27/3225; H01L 27/3244; H01L 27/3248; H01L 27/3276; H01L 27/3206;
(Continued)

(56) References Cited

U.S. PATENT DOCUMENTS 7,420,205 B2 * 9/2008 MacPherson ....... H01L 27/3211
257/40
8,502,465 B2 8/2013 Katona et al.
(Continued)

FOREIGN PATENT DOCUMENTS

CN 102630349 A 8/2012
CN 105070744 A 11/2015
(Continued)

OTHER PUBLICATIONS

PCT International Search Report and Written Opinion, PCT/US2018/027381, dated Jul. 3, 2018, 26 Pages.
(Continued)

*Primary Examiner* — Ida M Soward
(74) *Attorney, Agent, or Firm* — Fenwick & West LLP

(57) ABSTRACT

Inorganic and organic LEDs are integrated in a single chip. In an integrated multi-color micro-LED display panel, arrays of different color micro LEDs are integrated with corresponding driver circuitry. Some colors of micro LEDs are inorganic micro LEDs, and other colors are organic micro LEDs. Inorganic versus organic can be selected on the basis of efficiency, for example using inorganic micro LEDs for blue pixels and organic micro LEDs for red and green pixels. In one approach, an array of pixel drivers is first fabricated on a supporting substrate. Multiple strata of micro LEDs are then stacked on top of the base substrate. The strata containing inorganic micro LEDs are fabricated first,
(Continued)

with one color per stratum. A single stratum containing all of the organic micro LEDs is then fabricated at the top of the stack.

20 Claims, 8 Drawing Sheets

(51) Int. Cl.
*H01L 25/07* (2006.01)
*H01L 25/18* (2006.01)
*H01L 25/065* (2006.01)
*H01L 23/00* (2006.01)
*H01L 25/075* (2006.01)

(52) U.S. Cl.
CPC ...... *H01L 27/3248* (2013.01); *H01L 27/3276* (2013.01); *G09G 2300/0408* (2013.01); *G09G 2300/0443* (2013.01); *G09G 2300/0452* (2013.01); *H01L 24/32* (2013.01); *H01L 24/83* (2013.01); *H01L 25/0655* (2013.01); *H01L 25/0753* (2013.01); *H01L 25/18* (2013.01); *H01L 27/3206* (2013.01); *H01L 27/3211* (2013.01); *H01L 27/3216* (2013.01); *H01L 27/3218* (2013.01); *H01L 2224/32145* (2013.01); *H01L 2224/8393* (2013.01); *H01L 2251/301* (2013.01)

(58) Field of Classification Search
CPC ............ H01L 27/3211; H01L 27/3216; H01L 27/3218; H01L 25/167; H01L 25/0753; H01L 25/18; H01L 25/0655; H01L 2251/301; G09G 2300/0452; G09G 2300/0443
See application file for complete search history.

(56) References Cited

U.S. PATENT DOCUMENTS

| 8,970,131 | B2* | 3/2015 | Brandes | H05B 47/10 |
| | | | | 315/299 |
| 9,368,549 | B1 | 6/2016 | Oraw et al. | |
| 9,443,833 | B2* | 9/2016 | Oraw | H01L 24/18 |
| 9,726,887 | B2* | 8/2017 | Fleck | G02B 27/017 |
| 9,980,341 | B2* | 5/2018 | Bower | H05B 47/11 |
| 9,997,501 | B2* | 6/2018 | Bower | H01L 25/0753 |
| 10,032,757 | B2* | 7/2018 | Zhang | H01L 33/52 |
| 10,068,888 | B2* | 9/2018 | Zhang | H01L 33/0093 |
| 10,304,375 | B2* | 5/2019 | Chen | G09G 3/32 |
| 10,304,811 | B2* | 5/2019 | Zhang | H01L 25/50 |
| 10,325,893 | B2* | 6/2019 | Chong | H01L 25/167 |
| 10,380,930 | B2* | 8/2019 | Cok | G09G 3/3208 |
| 10,720,553 | B2* | 7/2020 | Liu | H01L 33/62 |
| 10,910,356 | B2* | 2/2021 | Zhang | H01L 25/167 |
| 10,937,924 | B2* | 3/2021 | Zou | H01L 25/0753 |
| 10,950,591 | B2* | 3/2021 | Hu | H01L 24/82 |
| 2003/0213967 | A1* | 11/2003 | Forrest | H01L 27/3209 |
| | | | | 257/96 |
| 2005/0100658 | A1* | 5/2005 | MacPherson | H01L 51/0004 |
| | | | | 427/58 |
| 2007/0121340 | A1* | 5/2007 | Hoshi | G02B 6/0021 |
| | | | | 362/600 |
| 2011/0001148 | A1* | 1/2011 | Sun | H01L 33/60 |
| | | | | 257/88 |
| 2011/0279054 | A1 | 11/2011 | Katona et al. | |
| 2012/0223875 | A1 | 9/2012 | Lau et al. | |
| 2013/0208026 | A1* | 8/2013 | Suzuki | H01L 25/0753 |
| | | | | 257/99 |
| 2014/0367633 | A1* | 12/2014 | Bibl | H01L 27/3246 |
| | | | | 257/13 |
| 2014/0367705 | A1* | 12/2014 | Bibl | H01L 33/44 |
| | | | | 438/27 |
| 2015/0187991 | A1* | 7/2015 | McGroddy | H01L 24/95 |
| | | | | 257/13 |
| 2015/0357315 | A1 | 12/2015 | Oraw | |
| 2015/0372052 | A1 | 12/2015 | Bower et al. | |
| 2016/0064363 | A1 | 3/2016 | Bower et al. | |
| 2016/0163940 | A1* | 6/2016 | Huang | H01L 33/62 |
| | | | | 257/89 |
| 2016/0231083 | A1 | 8/2016 | Regan et al. | |
| 2016/0351243 | A1* | 12/2016 | Ishizu | H01L 27/1207 |
| 2017/0025484 | A1 | 1/2017 | Forrest et al. | |
| 2017/0064291 | A1 | 3/2017 | Do et al. | |
| 2017/0069611 | A1 | 3/2017 | Zhang et al. | |
| 2017/0084671 | A1 | 3/2017 | Hack et al. | |
| 2017/0092863 | A1 | 3/2017 | Bower et al. | |
| 2017/0098740 | A1* | 4/2017 | Ohmae | H01L 25/0753 |
| 2017/0141155 | A1* | 5/2017 | Hughes | H01L 25/167 |
| 2017/0148771 | A1* | 5/2017 | Cha | H01L 25/0753 |
| 2017/0179192 | A1* | 6/2017 | Zhang | H01L 25/075 |
| 2017/0250318 | A1* | 8/2017 | Cha | H01L 33/504 |
| 2017/0323871 | A1* | 11/2017 | Yeh | G09G 3/32 |
| 2018/0033768 | A1* | 2/2018 | Kumar | H01L 24/97 |
| 2018/0082986 | A1* | 3/2018 | Abe | H01L 33/62 |
| 2018/0158704 | A1* | 6/2018 | Saketi | H01L 21/67144 |
| 2018/0158847 | A1* | 6/2018 | Chang | H01L 27/1259 |
| 2018/0190615 | A1* | 7/2018 | Pan | G06F 3/044 |

FOREIGN PATENT DOCUMENTS

| CN | 205944093 U | 2/2017 |
| CN | 106549034 A | 3/2017 |
| KR | 10-2017-0026935 A | 3/2017 |
| KR | 10-2017-0034307 A | 3/2017 |
| TW | 201611257 A | 3/2016 |
| WO | WO 2013/064800 A1 | 5/2013 |

OTHER PUBLICATIONS

European Patent Office, Extended European Search Report and Opinion, EP Patent Application No. 18783706.7, dated Oct. 9, 2020, eight pages.
Korean Intellectual Property Office, Office Action, KR Patent Application No. 10-2019-7032996, dated Dec. 23, 2020, 12 pages.
Japan Patent Office, Office Action, JP Patent Application No. 2019-555823, dated Jan. 4, 2022, 20 pages.
Taiwan Intellectual Property Office, Office Action, TW Patent Application No. 107112762, dated Dec. 28, 2021, 30 pages.

* cited by examiner

LED-OLED HYBRID SELF-EMISSIVE DISPLAY

CROSS-REFERENCE TO RELATED APPLICATION(S)

This application claims priority under 35 U.S.C. § 119(e) to U.S. Provisional Patent Application Ser. No. 62/484,979, entitled "LED-OLED Hybrid Self-Emissive Display," filed on Apr. 13, 2017. The subject matter of all of the foregoing is incorporated herein by reference in their entirety.

BACKGROUND

1. Field of the Invention

This disclosure relates generally to integrated multi-color LED display chips.

2. Description of Related Art

Active matrix liquid-crystal displays (LCD) and organic light emitting diode (OLED) displays combined with thin-film transistor (TFT) technology are becoming increasingly popular in today's commercial electronic devices. These displays are widely used in laptop personal computers, smartphones and personal digital assistants. Millions of pixels together create an image on a display. The TFTs act as switches to individually turn each pixel on and off, rendering the pixel light or dark, which allows for convenient and efficient control of each pixel and of the entire display.

However, conventional LCD displays suffer from low light efficiency, causing high power consumption and limited battery operation time. While active-matrix organic light-emitting diode (AMOLED) display panels generally consume less power than LCD panels, an AMOLED display panel can still be the dominant power consumer in battery-operated devices. To extend battery life, it is desirable to reduce the power consumption of the display panel.

Conventional inorganic semiconductor light emitting diodes (LEDs) have demonstrated better light efficiency, which makes active matrix LED displays more desirable for battery operated electronics. Arrays of driver circuitry and lighting-emitting diodes are used to control millions of pixels, rendering images on the display. However, the integration of thousands or even millions of micro LEDs with pixel driver circuit array is quite challenging.

As a result, there is a need for better display panels.

SUMMARY

The present disclosure overcomes the limitations of the prior art by integrating both inorganic and organic LEDs in a single chip.

One example is an integrated multi-color micro-LED display panel, in which arrays of different color micro LEDs are integrated with corresponding driver circuitry. Some colors of micro LEDs are implemented by inorganic micro LEDs, and other colors are implemented by organic micro LEDs. Inorganic versus organic can be selected on the basis of efficiency, for example using inorganic micro LEDs for blue pixels and organic micro LEDs for red and green pixels.

In one approach, an array of pixel drivers is first fabricated on a supporting substrate. Multiple strata of micro LEDs are then stacked on top of the base substrate. The strata containing inorganic micro LEDs are fabricated first, with one color per stratum. A single stratum containing all of the organic micro LEDs is then fabricated as the top stratum of the stack.

Other aspects include components, devices, systems, improvements, methods, processes, applications and other technologies related to any of the above.

BRIEF DESCRIPTION OF THE DRAWINGS

Embodiments of the disclosure have other advantages and features which will be more readily apparent from the following detailed description and the appended claims, when taken in conjunction with the accompanying drawings, in which:

The figures depict various embodiments for purposes of illustration only. One skilled in the art will readily recognize from the following discussion that alternative embodiments of the structures and methods illustrated herein may be employed without departing from the principles described herein.

DETAILED DESCRIPTION OF THE PREFERRED EMBODIMENTS

The figures and the following description relate to preferred embodiments by way of illustration only. It should be noted that from the following discussion, alternative embodiments of the structures and methods disclosed herein will be readily recognized as viable alternatives that may be employed without departing from the principles of what is claimed.

Figure 1:
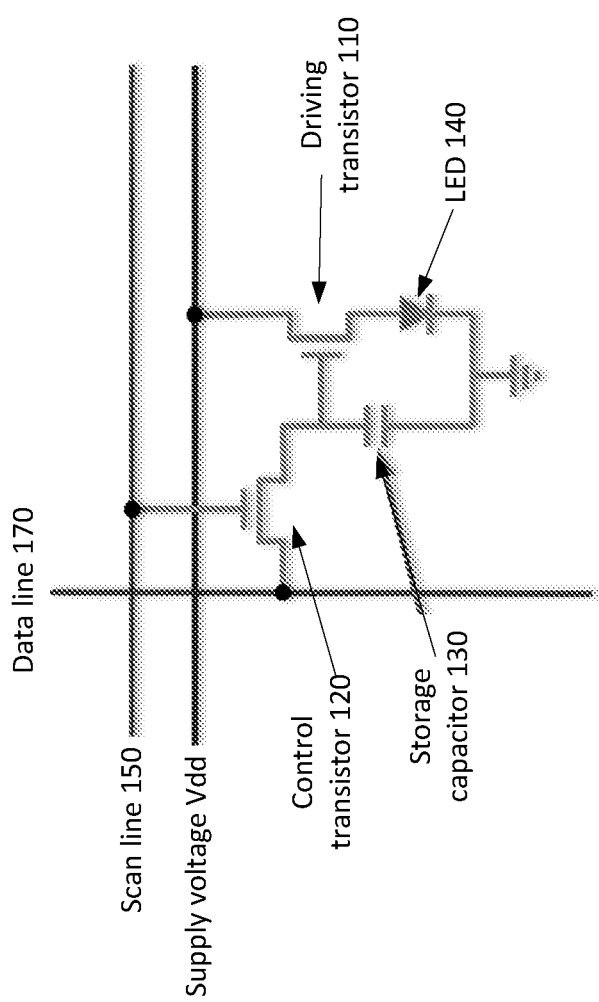
FIG. 1 is a circuit diagram of a pixel of a display panel, according to one embodiment.

FIG. 1 is a circuit diagram of a pixel of a display panel, which includes a pixel driver and LED 140, such as micro LEDs. Micro LEDs typically have a lateral dimension of 50 microns (um) or less, and can have lateral dimensions less than 10 um and even just a few um. In this example, the pixel driver includes two transistors and one capacitor 130, with one transistor being a control transistor 120 and the other being a driving transistor 110. In this example, the control transistor 120 is configured with its gate connected to a scan signal bus line 150, its one source/drain connected to a data signal bus line 170, and the other drain/source connected to the storage capacitor 130 and to the gate of the driving transistor 110. One source/drain of the driving transistor 110 is connected to a voltage supply, Vdd, and the other drain/source is connected to the p-electrode of the LED 140. The n-electrode of the LED 140 is connected to the capacitor 130 and to ground. In this example, when the scan signal 150 opens the gate of the control transistor 120, the data signal 170 charges the storage capacitor 130 and sets the driving transistor 110's gate voltage, which controls the current flow through the LED 140. The storage capacitor 130 here is used to maintain the gate voltage of the driving transistor 110, thus maintaining the current flowing through the LED 140 during the time that the scan signal 150 is setting other pixels. Other pixel driver designs will be apparent, for example as described in U.S. patent application Ser. No. 12/214,395, "Monolithic Active or Passive Matrix LED Array Display Panels and Display Systems Having the Same," which is incorporated herein by reference.

The following examples primarily use an integrated micro LED display chip in which array(s) of inorganic and organic micro LEDs are integrated with TFT or CMOS pixel drivers, but these are just examples and the techniques described are not limited to this particular application. Examples of inorganic micro LEDs include GaN based UV/blue/green micro LEDs, AlInGaP based red/orange micro LEDs, and GaAs or InP based infrared (IR) micro LEDs. Examples of organic micro LEDs include Triphenylamine derivatives (TPD) based materials for hole transport materials, oxadiazole derivatives (PBD) for electron transport materials, Alq3 as a host material with dopant TBP for blue emission, coumarin 545T or DMQA for green emission, rubrene for yellow emission and DCM or Ir(piq)3 for red emission. Additional examples of inorganic micro LEDs and other micro structures are described in U.S. patent application Ser. No. 15/135,217 "Semiconductor Devices with Integrated Thin-Film Transistor Circuitry", Ser. No. 15/269,954 "Making Semiconductor Devices with Alignment Bonding and Substrate Removal", Ser. No. 15/269,956 "Display Panels with Integrated Micro Lens Array", Ser. No. 15/272,410 "Manufacturing Display Panels with Integrated Micro Lens Array", and Ser. No. 15/701,450 "Multi-Color Micro-LED Array Light Source". All of the foregoing are incorporated by reference in their entirety.

Figure 2A:
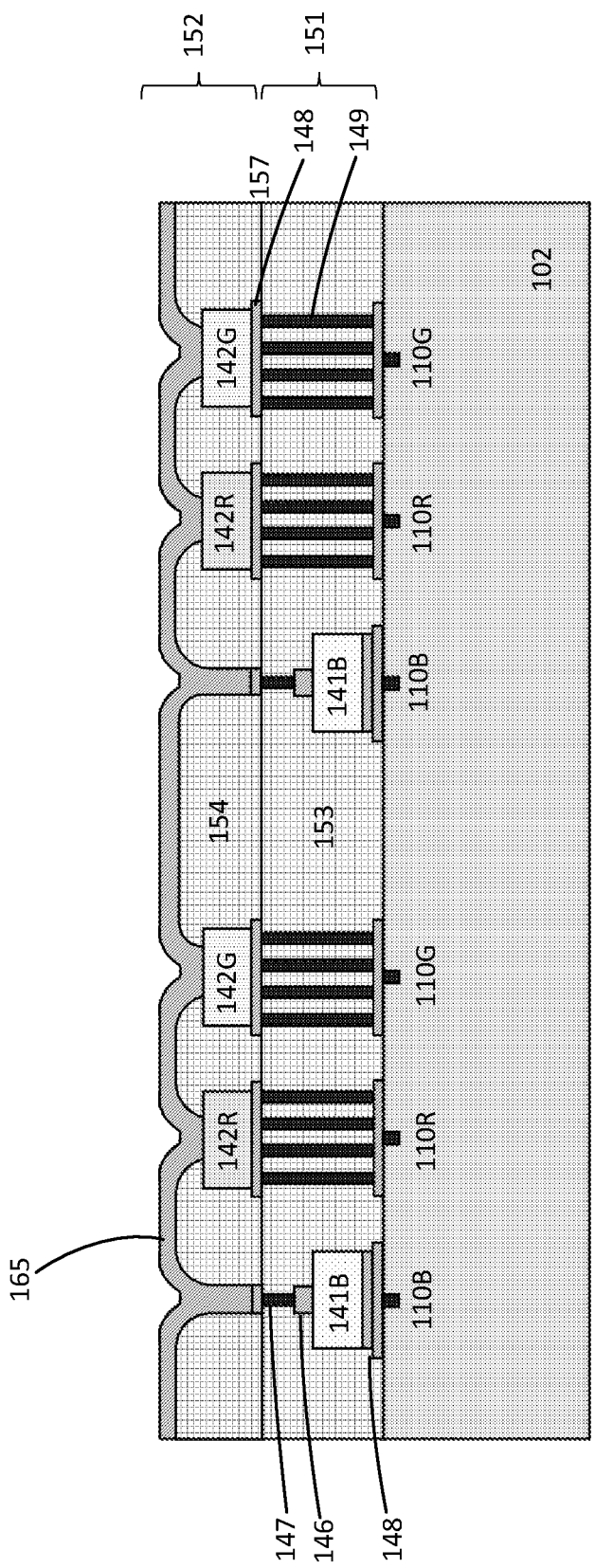
FIGS. 2A and 2B are cross-sectional views of several pixels of an integrated multi-color LED display panel, according to various embodiments.

FIG. 2A is a cross-sectional view of several pixels of an integrated multi-color LED display panel, according to one embodiment. In FIG. 2A, an array of individual driver circuits is fabricated on the supporting substrate 102. The black rectangles 110 shown in FIG. 2A represent electrical connections to the driver circuits, for example the connection between the driving transistor 110 and LED 140 in FIG. 1A. For convenience, these connections 110 may also be referred to as driver circuits 110 or pixel drivers 110. The driver circuits 110 are labeled with suffixes R,G,B, because they correspond to red, green and blue pixels. The array of pixel drivers 110 are electrically connected to a mixture of inorganic micro LEDs 141 and organic micro LEDs 142. These micro LEDs 141,142 are also labeled with suffixes R,G,B to indicate their color. In this example, inorganic LEDs 141 are used for the blue pixels, and organic LEDs 142 are used for the red and green pixels, because the different types of LEDs have higher external quantum efficiency at these wavelengths. By using a mixture of organic and inorganic micro LEDs, the overall efficiency can be increased. For example, the display panel can be designed so that the micro LEDs of each color have an external quantum efficiency (EQE) of at least 15%. Blue inorganic LEDs can have EQE of 50% or more. Red and green organic LEDs can have EQE of 15% or more.

In this example, the micro LEDs 141,142 are contained in different strata 151,152 which are stacked on top of the substrate and pixel drivers. The bottom stratum 151 contains the inorganic micro LEDs 141B and the top stratum contains the organic micro LEDs 142R,G. Which color is in which stratum can vary depending on the design. For convenience, "up" is used to mean away from the substrate 102, "down" means toward the substrate, and other directional terms such as top, bottom, above, below, under, beneath, etc. are interpreted accordingly.

Using the leftmost micro LED 141B as an example, the inorganic micro LEDs are formed from an epitaxial structure. Examples include III-V nitride, III-V arsenide, III-V phosphide, and III-V antimonide epitaxial structures. An upper contact metal pad 146 is electrically connected to the top of the micro LED 141 and is also electrically connected to a common electrode 165, using vias 147 through any intervening strata as necessary. For micro LED 141B, the vias 147 connect through the remainder of stratum 151 to the common electrode 165, which makes contact through an opening area in the organic stratum 152. A lower contact metal pad 148 is electrically connected to the bottom of the micro LED 141B and is also electrically connected to the corresponding pixel driver 110, using vias 149 through any intervening strata as necessary. Because micro LED 141B is in the bottom stratum, there are no intervening strata and no vias 149 are used.

For the rightmost organic micro LED 142G, vias 149 electrically connect the lower contact metal pad 148 through intervening stratum 151 to the corresponding pixel driver 110. No vias are needed to connect the top contact of micro LED 142G to the common electrode 165. In this example, each micro LED 141,142 is connected to a single common electrode 165, but this is not required as will be apparent in alternate designs shown below.

In this example, the stratum 151 for the inorganic LEDs is filled with material 153 so that the interfaces 157 between adjacent strata are planar. This facilitates fabrication of the next stratum. An example of fill material 153 is silicon dioxide, which is both non-conductive and transparent. This provides electrical isolation between micro LEDs and vias, but also allows light produced by micro LEDs in lower strata to propagate through the stratum. Another example of fill material 153 is silicon nitride. The top stratum 152 for the organic micro LEDs 142 may also be filled with material 154, for example dielectric materials similar to those used in the inorganic layers or polymer materials. The fill 153,154 for each stratum does not have to be a single homogenous material. Combinations of materials or structures can also be used. Regardless of the detailed structure, preferably each stratum is transparent in regions that are laterally located above micro LEDs of lower strata, so that light produced by the micro LEDs of the lower strata are able to propagate through such regions.

In more detail, the driver circuitry is fabricated as follows. The supporting substrate 102 is the substrate on which the array of individual driver circuits 110 is fabricated. In one embodiment, the substrate 102 is a Si substrate. In another embodiment, the supporting substrate 102 is a transparent substrate, for example, a glass substrate. Other example substrates include GaAs, GaP, InP, SiC, ZnO, and sapphire substrates. The driver circuits 110 form individual pixel drivers to drive the micro LEDs. The circuitry on substrate 102 includes contacts 110 to each individual pixel driver that protrude to the surface. The circuitry may also include a common electrode contact for each individual pixel driver. Each micro LED also has two contacts: one connected to the pixel driver and the other connected to ground (i.e., the common electrode).

In alternative embodiments not shown, the driver circuitry can include driver circuits other than CMOS driver circuits. As one example, the driver circuitry may include thin-film transistor (TFT) driver circuits. As another example, the driver circuitry can be circuitry using III-V compound semiconductors.

For clarity, FIG. 2A shows only six micro LEDs and corresponding pixel drivers. It should be understood that any number of micro LEDs and pixel drivers can be used. In a fully programmable display panel, the LEDs and driver circuits are arranged in arrays to form an array of individually addressable pixels, preferably multi-color pixels. In alternate embodiments, the display panel may have a more limited programmability and the pixels may be arranged in different geometries. In addition, there does not have to be a one to one correspondence between driver circuits and LEDs. For example, there could be two or more LEDs connected to the same pixel driver output to create redundancy, so that if one of the LEDs fails, the remaining LEDs could still light the pixel.

The micro LEDs can also be distributed into strata in different ways and there can also be different numbers of strata. In one approach, each stratum includes only inorganic micro LEDs or only organic micro LEDs but not both. In one fabrication approach, the strata containing inorganic micro LEDs are fabricated first at the bottom of the stack and these are then followed by the top strata containing the organic micro LEDs. The inorganic strata may be fabricated with micro LEDs of only one color per stratum, followed by a single top stratum that contains all of the organic micro LEDs.

The choice of whether a color is produced by inorganic or organic micro LEDs may also vary. Colors can include ultraviolet, blue, green, orange, red, and infrared. Here, terms such as light, optical and color are intended to include both ultraviolet and infrared. In the example above, blue was produced by inorganic micro LEDs and red and green were produced by organic LEDs. In some cases, shorter wavelengths are produced by inorganic micro LEDs and longer wavelengths are produced by organic LEDs.

Figure 2B:
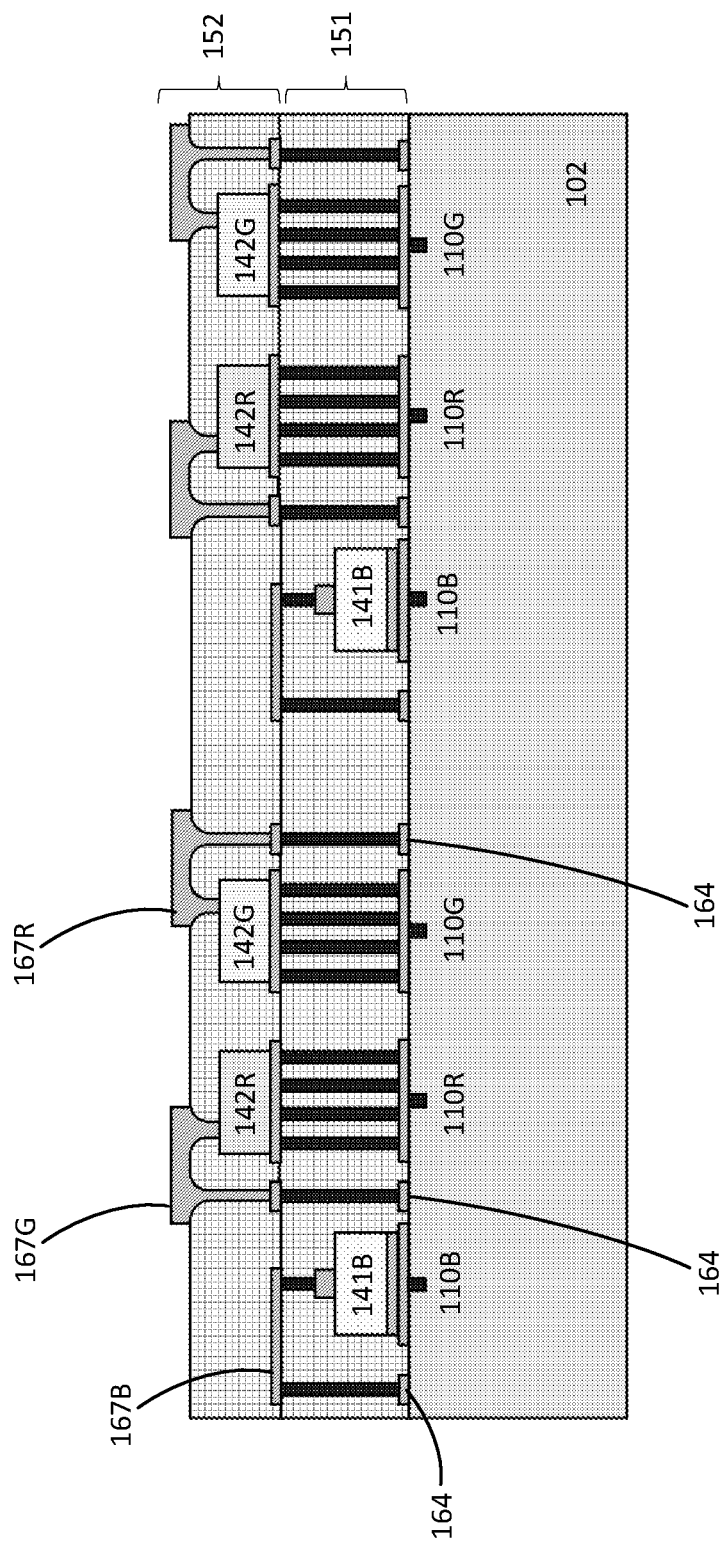

FIG. 2B shows an alternative design, where not every micro LED 141,142 is connected to the common electrode at the very top of the structure. Rather, the micro LEDs 141,142 of each stratum 151,152 are electrically connected to a common electrode 164 by a structure 167 located on top of that particular stratum. In this example, the red micro LED 142R is connected by structure 167R, the green micro LED 142G is connected by structure 167G, and blue micro LED 141B is connected by structure 167B. Connecting different micro LEDs 141,142 to common electrodes that are not connected to each other allows separate biasing of the micro LEDs.

Figure 3:
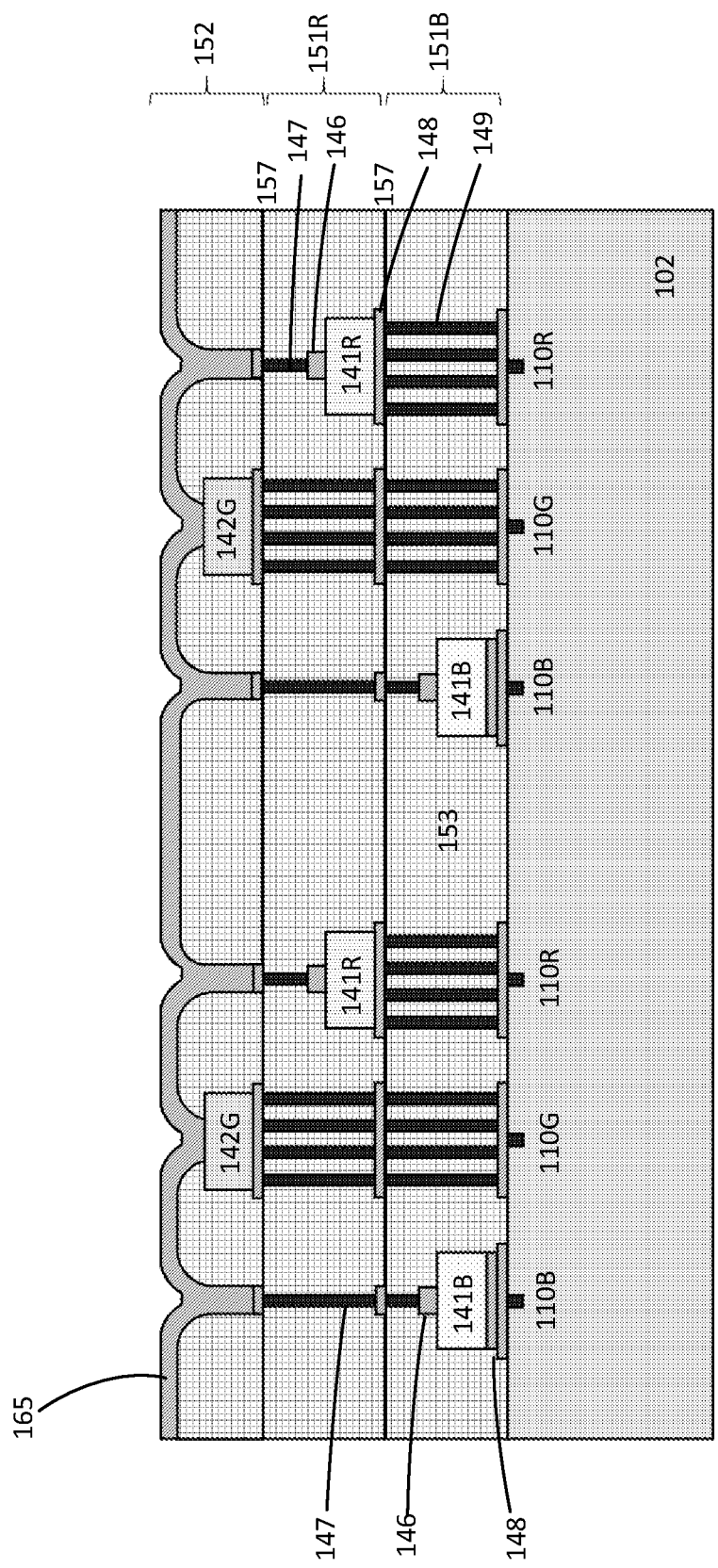
FIG. 3 is a cross-sectional view of several pixels of an integrated multi-color LED display panel, according to another embodiment.

FIG. 3 is a cross-sectional view of several pixels of an integrated multi-color LED display panel, according to another embodiment. In the previous FIG. 2, one color (blue) was produced by inorganic micro LEDs and the other two colors were produced by organic micro LEDs. In FIG. 3, two colors (blue and red) are produced by inorganic micro LEDs 141 and the third color (green) is produced by organic micro LEDs 142. In this example, the different color inorganic LEDs 141B,R are fabricated in separate strata 151B,R, so there are three total strata 151,152. The inorganic micro LEDs 141B,R have upper and lower contact metal pads 146, 148. One 148 is connected to the pixel driver 110 and the other 146 connected to the common electrode 165, using vias 147,149 as necessary. The organic micro LEDs 142G have lower contact metal pads 148 to connect to the pixel drivers 110. Because the organic micro LEDs are in the top stratum 152, the upper side of the LEDs can be connected directly to the common electrode 165.

The structures shown in FIGS. 2 and 3 can be fabricated as follows. First, the pixel drivers 110 are fabricated on substrate 102. Then the strata 151 containing the inorganic micro LEDs 141 are fabricated, with one color per stratum. Each stratum is fabricated by first bonding unpatterned epitaxial layers to the existing structure, patterning the epitaxial layers into individual micro LEDs and patterning the bonding metal layers into individual pads, and then fabricating vias and filling and planarizing the stratum. Using the structure of FIG. 3 as an example, stratum 151B for the inorganic blue micro LEDs is fabricated as follows. First, metal bonding layers are added to the unpatterned epitaxial layers for the blue micro LEDs 141B and to the substrate contacting the pixel drivers. These are used to bond the epitaxial layers to the substrate, making electrical contact with the pixel drivers. After removing the epitaxy substrate, the epitaxial layers and metal bonding layers are patterned to form individual micro LEDs 141B and lower contact metal pads 148. Upper contact metal pads 146 are also added. Fill material 153 is added and planarized. Vias 147,149 are fabricated. This process is repeated to form stratum 151R for the inorganic red micro LEDs. For more details, see International Patent Application No. PCT/US2018/023172, "Making Semiconductor Devices by Stacking Strata of Micro LEDS," which is incorporated by reference herein in its entirety.

After all of the inorganic strata 151 are fabricated, a single top stratum 152 containing all of the organic micro LEDs 142 is fabricated. The organic LED layers including the electron injection material, electron transport material, emission layer with different dopants, hole transport material and hole injection material are deposited layer by layer using spin coat method to form the diode structure in the vertical direction. Then the organic LED layers are patterned and etched into individual mesas. After that, another insulating polymer material is coated for planarization. The contact window is opened in the top of the organic LED mesas and areas where vias of other stratas are present. Finally, the top common cathode contact 165 is deposited.

Figure 4:
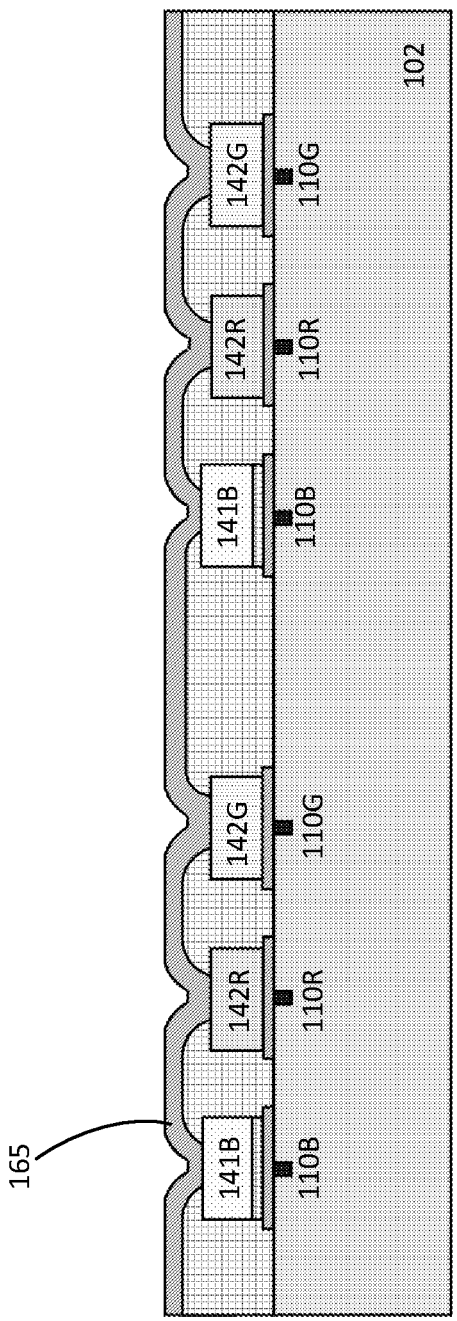
FIG. 4 is a cross-sectional view of several pixels of an integrated multi-color LED display panel, according to yet another embodiment.

In an alternative approach, the organic micro LEDs can be fabricated in the same layer as the inorganic micro LEDs. FIG. 4 shows such a design. Here, the blue inorganic micro LEDs 141B are first fabricated on top of the substrate 102 and pixel drivers 110B. These are then followed by the red and green organic micro LEDs 142, which are positioned between the blue LEDs. A common electrode 165 is electrically connected to the micro LEDs 141,142. There are no separate strata or vias through strata.

Figure 5B:
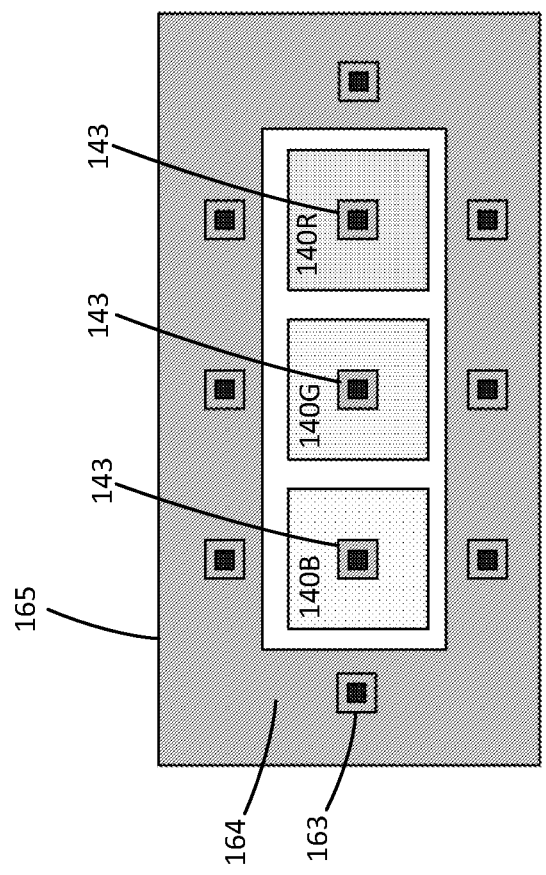
FIGS. 5A and 5B are top views of common electrodes, according to two embodiments.
Figure 5A:
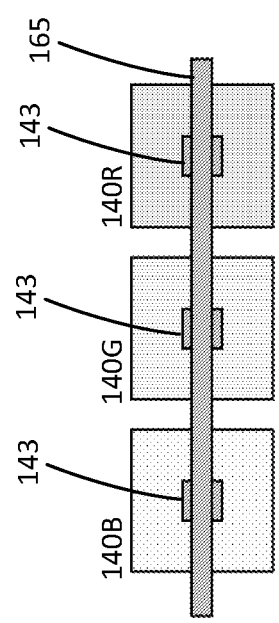

In FIGS. 2-4, the common electrode 165 could be a grid of (opaque) metal traces, as shown in FIG. 5A. FIG. 5A is a top view, looking down at the device. FIG. 5A shows three micro LEDs 140R,G,B, represented by the large squares. Each of these micro LEDs has a structure 143 of vias and metal pads that electrically connect the top of the micro LED to the top of the stack of strata. These are represented by the small squares 143 in FIG. 5A. The long rectangle 165 is a metal trace serving as the common cathode that electrically connects to the vias/metal pads 143.

Alternatively, the common electrode 165 could be a transparent electrode, such as indium tin oxide, as shown in FIG. 5B. FIG. 5B is also a top view showing micro LEDs 140R,G,B and their interconnects 143. In this example, the common electrode 165 is the entirety of the rectangle defined by the boundary 165. It is acceptable to cover all of the micro LEDs because the electrode 165 is transparent. The rectangular annulus 164 is the common cathode metal pad connecting to the circuitry. Note that the common electrode 165 is above all the strata, while the metal pad 164 is below all the strata. They are electrically connected by vias 163.

Figure 6:
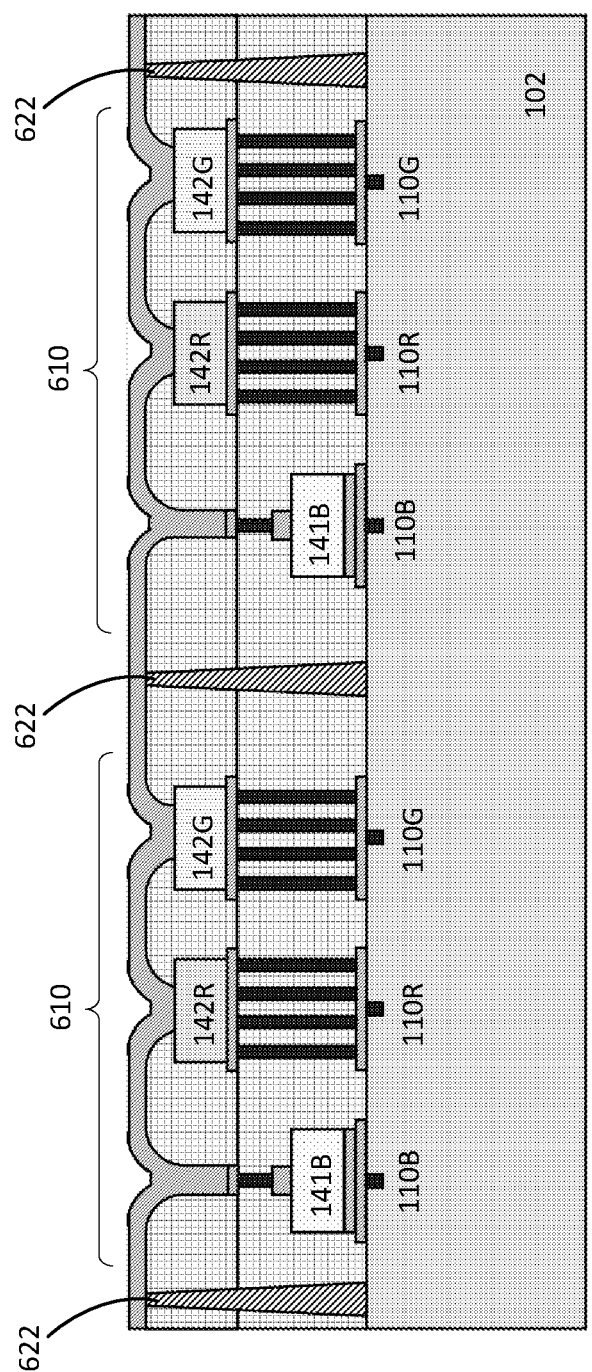
FIG. 6 is a cross-sectional view illustrating structures for optical isolation, according to one embodiment.

FIG. 6 illustrates additional structure that provides optical isolation of different pixels. In this example, red, green and blue pixels are grouped into multi-color pixels 610 and a structure in the strata functions to optically separate adjacent pixels. This can reduce cross-talk between adjacent multi-color pixels 610. In FIG. 6, the structure is a grid of opaque (absorbent) dividers 622. Alternatively, the structure 622 could be reflective, which can also function to increase the directionality and efficiency of light production by the micro LEDs. The lower contact metal pads for each micro LED could also be reflective.

Figure 7:
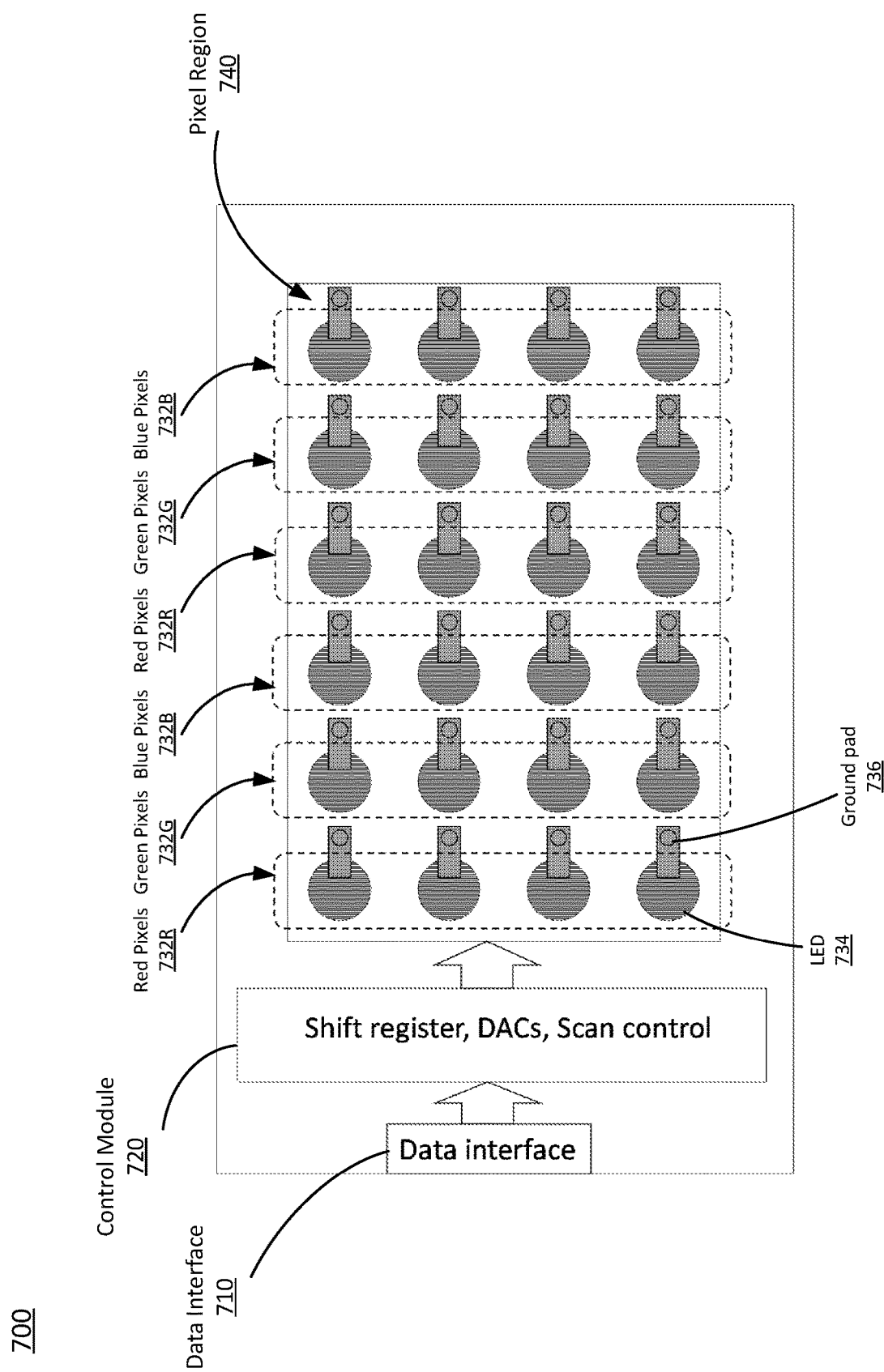
FIG. 7 is a top view of an example display panel with an array of pixels, according to one embodiment.

FIG. 7 is a top view of an example micro LED display panel 700, according to one embodiment. The display panel 700 includes a data interface 710, a control module 720 and a pixel region 740. The data interface 710 receives data defining the image to be displayed. The source(s) and format of this data will vary depending on the application. The control module 720 receives the incoming data and converts it to a form suitable to drive the pixels in the display panel. The control module 720 may include digital logic and/or state machines to convert from the received format to one appropriate for the pixel region 740, shift registers or other types of buffers and memory to store and transfer the data, digital-to-analog converters and level shifters, and scan controllers including clocking circuitry.

The pixel region 740 includes an array of pixels. The pixels include micro LEDs 734 monolithically integrated with pixel drivers, for example as described above. In this example, the display panel 700 is a color RGB display panel. It includes red, green and blue pixels, arranged in columns. Columns 732R are red pixels, columns 732G are green pixels and columns 732B are blue pixels. Within each pixel, an LED 734 is controlled by a pixel driver. The pixel makes contact to a supply voltage (not shown) and ground via a ground pad 736, and also to a control signal, according to the embodiments shown previously. Although not shown in FIG. 7, the p-electrode of LED and the output of the driving transistor are positioned underneath the LED 734, and they are electrically connected by bonding metal. The LED current driving signal connection (between p-electrode of LED and output of the pixel driver), ground connection (between n-electrode and system ground), the Vdd connection (between source of the pixel driver and system Vdd), and the control signal connection to the gate of the pixel driver are made in accordance with various embodiments described previously.

FIG. 7 is merely a representative figure. Other designs will be apparent. For example, the colors do not have to be red, green and blue, and there do not have to be equal numbers of each color pixel. They also do not have to be arranged in columns or stripes. A set of four color pixels could be arranged as a 2×2 square, for example. Individual pixel cells could also be arranged to share row or column addressing, thus reducing the total number of row or column traces. As one example, apart from the arrangement of a square matrix of pixels shown in FIG. 7, an arrangement of hexagonal matrix of pixels can also be used to form the display panel 700.

In some applications, a fully programmable rectangular array of pixels is not necessary. Other designs of display panels with a variety of shapes and displays may also be formed using the device structures described herein. One class of examples is specialty applications, including signage and automotive. For example, multiple pixels may be arranged in the shape of a star or a spiral to form a display panel, and different patterns on the display panel can be produced by turning on and off the LEDs. Another specialty example is automobile headlights and smart lighting, where certain pixels are grouped together to form various illumination shapes and each group of LED pixels can be turned on or off or otherwise adjusted by individual pixel drivers.

Even the lateral arrangement of devices within each pixel can vary. In FIGS. 2-4 the LEDs and pixel drivers are arranged vertically. Each LED is located "on top of" the corresponding pixel driver circuit. Other arrangements are possible. For example, the pixel drivers could also be located "behind", "in front of" or "beside" the LED.

Different types of display panels can be fabricated. For example, the resolution of a display panel can range typically from 8×8 to 3840×2160. Common display resolutions include QVGA with 320×240 resolution and an aspect ratio of 4:3, XGA with 1024×768 resolution and an aspect ratio of 4:3, HD with 1280×720 resolution and an aspect ratio of 16:9, MD with 1920×1080 resolution and an aspect ratio of 16:9, MD with 3840×2160 resolution and an aspect ratio of 16:9, and 4K with 4096×2160 resolution. There can also be a wide variety of pixel sizes, ranging from sub-micron and below to 10 mm and above. The size of the overall display region can also vary widely, ranging from diagonals as small as tens of microns or less up to hundreds of inches or more.

Different applications will also have different requirements for optical brightness. Example application include direct viewing display screens, light engines for home/office projectors and portable electronics such as smart phones, laptops, wearable electronics, and retinal projections. The power consumption can vary from as low as a few milliwatts for retinal projectors to as high as kilowatts for large screen outdoor displays, projectors, and smart automobile headlights. In terms of frame rate, due to the fast response (nanoseconds) of inorganic LEDs, the frame rate can be as high as KHz, or even MHz for small resolutions.

Although the detailed description contains many specifics, these should not be construed as limiting the scope of the invention but merely as illustrating different examples and aspects of the invention. It should be appreciated that the scope of the invention includes other embodiments not discussed in detail above. For example, the approaches described above can be applied to the integration of functional devices in addition to LEDs and with control circuitry other than pixel drivers. Examples of non-LED devices include vertical cavity surface emitting lasers (VCSEL), photodetectors, micro-electro-mechanical system (MEMS), silicon photonic devices, power electronic devices, and distributed feedback lasers (DFB). Examples of other control circuitry include current drivers, voltage drivers, transimpedence amplifiers, and logic circuits.

Various other modifications, changes and variations which will be apparent to those skilled in the art may be made in the arrangement, operation and details of the method and apparatus of the present invention disclosed herein without departing from the spirit and scope of the invention as defined in the appended claims. Therefore, the scope of the invention should be determined by the appended claims and their legal equivalents.

What is claimed is:

1. An integrated multi-color micro-LED display chip, comprising:
   a substrate;
   an array of pixel drivers supported by the substrate; and
   a plurality of arrays of different color micro LEDs supported by the substrate and electrically connected to the array of pixel drivers, wherein at least one of the arrays comprises organic micro LEDs of a first color and another one of the arrays comprises inorganic micro LEDs of a different color.

2. The integrated multi-color micro-LED display chip of claim 1, wherein the plurality of arrays comprise an array of red micro LEDs, an array of green micro LEDs, and an array of blue micro LEDs.

3. The integrated multi-color micro-LED display chip of claim 2, wherein the blue micro LEDs are inorganic micro LEDs, and the red and green micro LEDs are organic micro LEDs.

4. The integrated multi-color micro-LED display chip of claim 3, wherein the blue micro LEDs are GaN based inorganic micro LEDs.

5. The integrated multi-color micro-LED display chip of claim 2, wherein the blue and red micro LEDs are inorganic micro LEDs and the green micro LEDs are organic micro LEDs.

6. The integrated multi-color micro-LED display chip of claim 1, wherein the different color micro LEDs are ultra-violet, blue, green, orange, red, or infrared micro LEDs.

7. The integrated multi-color micro-LED display chip of claim 1, wherein the different color micro LEDs are arranged into two or more strata stacked on top of the substrate and pixel drivers, with a planar interface between adjacent strata, and all micro LEDs of a same color are contained in one of the strata.

8. The integrated multi-color micro-LED display chip of claim 7, wherein each stratum contains only inorganic micro LEDs or only organic micro LEDs but not both.

9. The integrated multi-color micro-LED display chip of claim 8, wherein the strata(um) containing inorganic micro LEDs are at a bottom of the stack, and the strata(um) containing organic micro LEDs are at a top of the stack.

10. The integrated multi-color micro-LED display chip of claim 7, wherein each strata(um) containing inorganic micro LEDs contains inorganic micro LEDs of only a single color.

11. The integrated multi-color micro-LED display chip of claim 7, wherein all organic micro LEDs are contained in a single stratum.

12. The integrated multi-color micro-LED display chip of claim 7, wherein each stratum containing inorganic micro LEDs comprises:
lower contact metal pads electrically connected to a bottom of the micro LEDs; and
upper contact metal pads electrically connected to a top of the micro LEDs;
wherein the lower contact metal pads are also electrically connected to the array of pixel drivers and the upper contact metal pads are also electrically connected to a common electrode.

13. The integrated multi-color micro-LED display chip of claim 12, wherein the common electrode includes a top electrode on top of all the strata, each upper contact metal pad electrically connected to the top electrode by vias through any intervening strata.

14. The integrated multi-color micro-LED display chip of claim 12, wherein the common electrode comprises a separate common electrode structure for each stratum located on top of that stratum, each upper contact metal pad for each stratum electrically connected to the common electrode structure for that stratum.

15. The integrated multi-color micro-LED display chip of claim 7, wherein the micro LEDs of different strata are grouped into multi-color pixels, and the micro-LED display chip further comprises:
a structure in the strata that optically separates adjacent multi-color pixels.

16. The integrated multi-color micro-LED display chip of claim 1, wherein all of the micro LEDs are vertically positioned in a single layer above the substrate and pixel drivers.

17. The integrated multi-color micro-LED display chip of claim 1, wherein the micro LEDs are not larger than 50 microns in any lateral dimension.

18. The integrated multi-color micro-LED display chip of claim 1, wherein the array of micro LEDs for each color has an external quantum efficiency of at least 15%.

19. The integrated multi-color micro-LED display chip of claim 1, wherein the pixel drivers comprise thin-film transistor pixel drivers or silicon CMOS pixel drivers.

20. The integrated multi-color micro-LED display chip of claim 1, wherein:
the plurality of arrays of different color micro LEDs comprise an array of red micro LEDs, an array of green organic micro LEDs and an array of blue inorganic micro LEDs, all of the arrays of micro LEDs supported by the substrate and electrically connected to the array of pixel drivers; and
the different color arrays of micro LEDs are arranged into two or more strata stacked on top of the substrate and pixel drivers, with a planar interface between adjacent strata, and the blue inorganic micro LEDs are contained in a bottom one of the strata and the green organic micro LEDs are contained in a top one of the strata.

* * * * *